United States Patent [19]
Casey

[11] Patent Number: 5,274,497
[45] Date of Patent: Dec. 28, 1993

[54] CONCENTRATING COLLECTOR LENS ASSEMBLY

[76] Inventor: Paul A. Casey, P.O. Box 368, Sun Valley, Calif. 91352

[21] Appl. No.: 800,114

[22] Filed: Nov. 29, 1991

[51] Int. Cl.⁵ .......................... G02B 17/00; G02B 9/08
[52] U.S. Cl. ................................... 359/364; 359/727; 359/738; 359/853
[58] Field of Search ............... 359/642, 724–732, 850–853, 867–869, 894, 362–366, 126/438–441, 600, 684, 700, 909

[56] References Cited

U.S. PATENT DOCUMENTS

| | | | |
|---|---|---|---|
| 3,064,526 | 11/1962 | Lindsay | 359/869 |
| 3,892,476 | 7/1975 | Sherman, Jr. | 359/853 |
| 4,871,249 | 10/1989 | Watson | 359/858 |
| 4,893,612 | 1/1990 | Dawson | 126/438 |

OTHER PUBLICATIONS

"Design of Nonimaging Concentrators as Second Stages in Tandem with Image-Forming First Stage Concentrators", Winston et al, Applied Optics, vol. 19, No. 3, Feb. 1980.

*Primary Examiner*—Bruce Y. Arnold
*Assistant Examiner*—Thong Nguyen
*Attorney, Agent, or Firm*—Marvin H. Kleinberg

[57] ABSTRACT

A concentrating lens has a receiving surface that is substantially spherical and a rear or reflecting surface that is substantially hyperbolic. The reflected radiation is directed to a focusing concavity in the receiving surface from which the resultant concentrated beam emerges, substantially in a direction that is opposite to the direction of the impinging radiation.

19 Claims, 6 Drawing Sheets

CONCENTRATING COLLECTOR LENS ASSEMBLY

The present invention relates to lenses and, more particularly to an optical lens assembly capable of collecting and concentrating impinging radiation into a narrow collimated beam. Although this invention will be described and discussed in connection with applications in the optical portion of the electromagnetic spectrum, it is to be understood that the principles are equally applicable to radiation of longer or shorter wavelengths, as well.

It has long been known that the sun is a promising source of energy that is non polluting and environmentally safe. Present day efforts to utilize the sun have taken advantage of the heat energy available in the form of infra red radiation. Other efforts have been directed to the conversion of sunlight to electrical energy through photovoltaic solar cells.

A problem with the efficient utilization of solar energy has been the low power usually encountered using direct sunlight. Sunlight normally generates less than 1 milliwatt per square millimeter, which is far too little energy to do much in the way of useful work. Experimenters have found that using a 16 inch telescope mirror, a beam can be directed into a sapphire "concentrator" funnel which is capable of providing up to 72 watts per square millimeter.

Other researchers have been experimenting with large collectors such as parabolic mirrors, parabolic troughs, or other concentrating collectors, all of which direct the sun's energy to a conduit containing a working fluid which is heated and which transports or conveys the heat to either a storage system or to a heat exchanging system.

An overview of the prior art efforts to date has been provided in an article entitled "Nonimaging Optics" by Roland Winston in the March 1991 issue of the *SCIENTIFIC AMERICAN*. In that article, a conical sapphire concentrator was disclosed which is placed at the focus of a collecting lens or mirror.

What is needed and what is provided by the present invention is a lens system that can receive a concentrated beam and further concentrate the solar energy into an even smaller collimated beam of much greater intensity and power. Such a beam can be capable of vaporizing most liquids and can melt or even vaporize many solids without the need for an intermediate working fluid.

BRIEF SUMMARY OF THE INVENTION

According to the present invention, a light concentrating lens converts general incident light into a small collimated beam by gathering the light from a larger area and intensifying it in a smaller specific area, thus boosting the power potential and its reactive properties at that constricted smaller area. This is accomplished in a unitary device which concentrates and collimates the energy within a single refracting body.

The source light may be direct, ambient, or it may be pre-concentrated by a collector system. The collimated beam can be confined to a chosen light frequency (color) or frequency band which may be any band within the radiant spectrum, depending upon its intended use. For example, ultra-violet light can be used for sterilization and medical treatment. The visible band may be most useful for image enhancement, illumination or signalling. Thermal power, using the infra-red frequencies, can be best utilized in applications such as desalinization, steam generation, or can be used in manufacturing processes where high temperatures are needed in a localized area.

According to the present invention, incident light enters a forward, receiving face of a lens element. The light is reflected back internally from a rear face, and exits through a focusing concavity that is formed in the forward face. The lens may be "thick" or "thin", depending upon the specific task it is to perform. In general, the embodiments intended for power application should be "thick", while embodiments which select portions of the spectrum should be "thin".

The forward (receiving) face is preferably a segment of spherical surface. The rear (reflecting) face should be a hyperbolic mirror, which redirects the light internally to converge at a focal point on the axis of rotation, at or near its intersection with the forward face. Before the converging light actually reaches the focal point, however, it enters a concave space that is the focussing cavity which aligns the emitted beam partially as a function of the Index of Refraction of the material comprising the lens.

The focussing concavity which acts as a focusing surface may be simple or compound, depending upon the cone of transmission within the lens itself. The cone of transmission is defined by the circumference of the hyperbolic mirror at its base, and its apex being the focus of that mirror at the center of the forward surface.

If the angle of the cone is below 30 degrees radius, the focusing element may be a simple circular concave cup. If the angle of the cone is between 30 and 45 degrees radius, the focusing element is preferably a compound "pit", involving several interior "cuts" in addition to the circular cup.

The receiving surface which is usually hemispheric, can be placed at the focus of a collecting dish. The incoming light enters the lens at a perpendicular to the surface, which eliminates the scattering of its different frequencies by refraction. The reflective surface, with its "Inner Focus" at the origin of the hemisphere, redirects the light internally, again eliminating the problem of scattering, and concentrates it in a "cone of light" whose tip is the "outer focus" of the hyperbolic curve.

The third, or focussing surface (either simple or compound) is a "tuning" device, cut to align a specific frequency (or band of frequencies) into a parallel emitted beam. This can be calculated with reference to the Index of Refraction IR of the lens medium at that chosen frequency (or band). A light corridor or beam guide, which captures and aligns whatever additional frequencies are desired to be included in the collimated beam, is provided external to the lens.

In the normal lens configuration, there are two fundamental conditions. The first is that the distance between the inner and outer foci of the hyperbolic curve be equal or nearly equal to the radius of the hemisphere. Second, the base of the hemisphere is equal to or greater than the base of the hyperbolic section.

A "thick" lens is created whose two foci lie exactly upon the rotational axis, with one focus being the origin of the hemisphere and the other at or near the forward surface. If the foci mark the exact termini of the axial radius of the hemisphere, then:

V = the Vertex of the hyperbola,
f = the Inner Focus of the hyperbola, and
r = the radius of the hemisphere, $2V + 2[f - V] = r$; or $2f = r$.

For designs with space limitations or the need for narrower band outputs, a "thin lens" design may be preferable. This embodiment incorporates a circular segment at the forward surface, where light input from a remote collector does not enter at the perpendicular. The index of refraction must be accounted for in the hyperbolic formulation of the second (reflecting) surface, which immediately involves a chosen frequency.

This approach is of great help in "purifying" a narrow band output, since the reflective surface focuses only that particular chosen wavelength, while adjacent frequencies begin scattering before they reach the beam-focusing surface. The resulting beam frequency is therefore "selected-out" twice in the process.

The inner focus of the hyperbolic surface is displaced from the origin of the circular surface, when thinning of the lens is desirable. Further, the inner focus of the hyperbolic curve must be relocated to the "virtual" origin of the circular surface, to compensate for the deflection of the incident light vectors. Likewise, the a and b semi-axes must rotate correspondingly, to describe the changing curvature of the hyperbolic curve.

To create a "thick" lens, a hemispheric lens face has a concave hyperbolic rear surface cut into the center of its base plane, with its radius not exceeding 57.5 percent of the hemispheric radius. The hyperbolic surface is on the same rotational axis, with its inner focus exactly at the origin of the hemisphere, and with its edges intersecting the great circle of the base plane. The "outer focus" of the hyperbolic curve lies upon the axis at or near the point where the hemispheric surface is intersected by the axis.

The distance between the inner and outer foci of the hyperbolic surface will affect the cross-section of the emitted beam, as does the radius of the hyperbolic surface. The smaller the radius and the shorter the distance, the smaller the diameter of the beam.

This can be envisioned by a cone, with its base at the circular edge of the hyperbolic cut (a center portion of the base of the main hemisphere) and its tip passing through the center of the hemispheric side. This is actually the area in which all the incoming light concentrates, as it rebounds toward the focus.

At the point where this cone intersects the front surface, the converging light passes through the focussing surface element, which is cut to the curvature that refracts a specifically chosen frequency into a beam of parallel light. In the simple version, this can cut be a section of a small, circular cup.

For designs with space limitations or the need for narrower band outputs, a relatively "thin" lens design may be preferable. This design incorporates a circular segment at the forward surface where light input from a collector does not enter at the perpendicular. The index of refraction must be accounted for in the hyperbolic formulation of the second (reflecting) surface, involving a selected frequency. If the reflecting surface can only focus a particular wavelength, the components of different wavelengths tend to scatter before reaching the beam-focusing surface.

When the "thinning" of the lens is desirable, the inner focus of the hyperbolic surface is displaced from the origin of the circular surface. To compensate for the deflection of the incident light vectors, the inner focus of the hyperbolic curve must be relocated to the virtual origin of the circular surface. Likewise, the a and b semi-axes must rotate correspondingly, to describe the changing curvature of the hyperbolic curve.

In most of these cases, the hyperbolic surface will be reduced in area, relative to the circular surface. There are any number of variables in this regard. In a situation where $r^2 > a^2 + b^2$, the equation must include a correction for the index of refraction i of the lens medium, plus the increased angle of incidence, as the incoming rays strike the surface of the lens.

The hyperbolic surface must "flatten" to accommodate these changes. If $F_1$ remains fixed, a decreases and b increases by the surface angle eccentricity, which is a function of sin i or the sine of the angle of incidence. As the ratio of $r^2/(a^2 + b^2)$ increases, so does the angle of incidence (over each portion of the lens), and therefore each corresponding angle of reflection widens, which has an accelerated "flattening" effect on the hyperbolic curve of the rear surface.

The flat variation is the theoretical limit to this variable. However this value cannot be attained practically, due to the presence of an non-negligible index of refraction which is inherent in any physical structure.

Narrow band, high intensity, highly directional output beams have many important scientific uses, such as space communications. If the inner focus rises above the plane which marks the maximum diameter of the lens, the function becomes elliptical, with the rear surface becoming convex, instead of concave. However, the secondary focus must remain at the axial center of the circular face of the lens, upon or just in front of the surface, as before.

If a more general input is desired, rather than from a collecting dish, a nearly spherical outer surface can receive any perpendicular incident light and transmit it to the beam-emitting surface. In this case, the reflecting surface must be a steeper and narrower concave hyperbolic mirror, which penetrates beyond the center of the lens, so that its inner focus corresponds with the origin of the sphere.

Uses for this alternative configuration include daytime light markers, light enhancing "flashlights" on tools, surveying, spot heating, signalling gear for hikers or boaters, local area illumination, etc. since the device of this embodiment can collect and concentrate impinging ambient light and convert it to a narrow, collimated beam.

The overall dimensions of the lens have no theoretical optical effect on its operation. Basically, the diameter of the focusing element determines the beam-width. However, there are practical thermal considerations. The larger the reflective surface area, the higher its thermal tolerance will be. The thermal intensification required of the system is normally the determining factor for the size and design of the lens.

In the simpler versions, the "cone of transmission" (the light reflected back from the second surface) is received through a small, circular cup, which then refracts the chosen frequency into a collimated beam. However, this simple version is limited to a cone of about 60 degrees. In turn, this restricts the reflecting surface. Accordingly, a compound focusing pit can be employed to expand the active reflecting surface out to a cone of about 90 degrees.

The compound pit combines the simple circular cup, which receives the central 60 degree portion, with a "ring" band, which refracts and re-directs an additional, outer 15 degrees of the cone up through the focus of a small parabolic cut at the top, where it is aligned with the central portion.

The thermal advantage of the compound focusing pit is considerable, since it essentially doubles the active reflecting surface. In this variation, the point of the cone can be exactly upon the face of the lens, where it is intersected by the axis of rotation.

The diameter of the emitted beam is determined by the width of the cone of transmission where it intersects the front surface of the lens. The closer the tip of the cone is to the surface of the lens, the smaller the cross-section of the beam.

This establishes the internal intensification factor of the lens. This is not to be confused with the intensification factor of the system, which is the ratio of the total collecting dish area to the beam width. There are unique capabilities associated with high thermal intensification. However, for general power applications, more modest levels are preferable. This can be determined through the design of the lens and its system.

A lens with very high intensity internal factor can make efficient use of small amounts of available sunlight. However, where light is more plentiful, a lower intensity factor might make better use of the same system.

Formulating any single lens design is a standard mathematical process, used in all optical applications. Following a particular wavelength from incidence at the first surface, to incidence and reflection at the second surface, to refraction at the third surface enables the creation of the appropriate lens. All the specific values are variable, according to the chosen wavelength and the index of refraction of the chosen lens medium.

At this date, new lens media are continually being developed for higher power ratings and durability in lasers of the infra-red band. This pioneer area of rapid development is especially promising for the lens structure of the present invention. Zinc Selenide, for example, can be used to fabricate a lens of high transmission in the 10.6 micron range and can receive 5,000 Watts per cubic centimeter. This offers about the highest present power in the infra red portion of the spectrum. With the addition of sapphire and other coatings of less than 25 millionths of an inch thickness, some of these qualities can be extended still further. At least one ZnSe lens has already been produced with a 26 inch diameter. All of these factors are combining to extend the eventual range of the lenses of the present invention.

In summary, the present invention can combine five functions within a single element. The element receives radiant energy, redirects the direction of the energy beam internally, concentrates the radiant energy internally, aligns the energy beams and projects a collimated beam of concentrated energy.

Because the various elements that determine focus are in fixed interrelationships, the accuracy of focus is not subject to external forces or stresses. Moreover, the direction reversal is accomplished internally before the energy beam is fully concentrated, thereby permitting maximum energy in the emerging beam.

The novel features which are characteristic of the invention, both as to structure and method of operation thereof, together with further objects and advantages thereof, will be understood from the following description, considered in connection with the accompanying drawings, in which the preferred embodiment of the invention is illustrated by way of example. It is to be expressly understood, however, that the drawings are for the purpose of illustration and description only, and they are not intended as a definition of the limits of the invention.

DETAILED DESCRIPTION OF THE DRAWINGS

Figure 1:
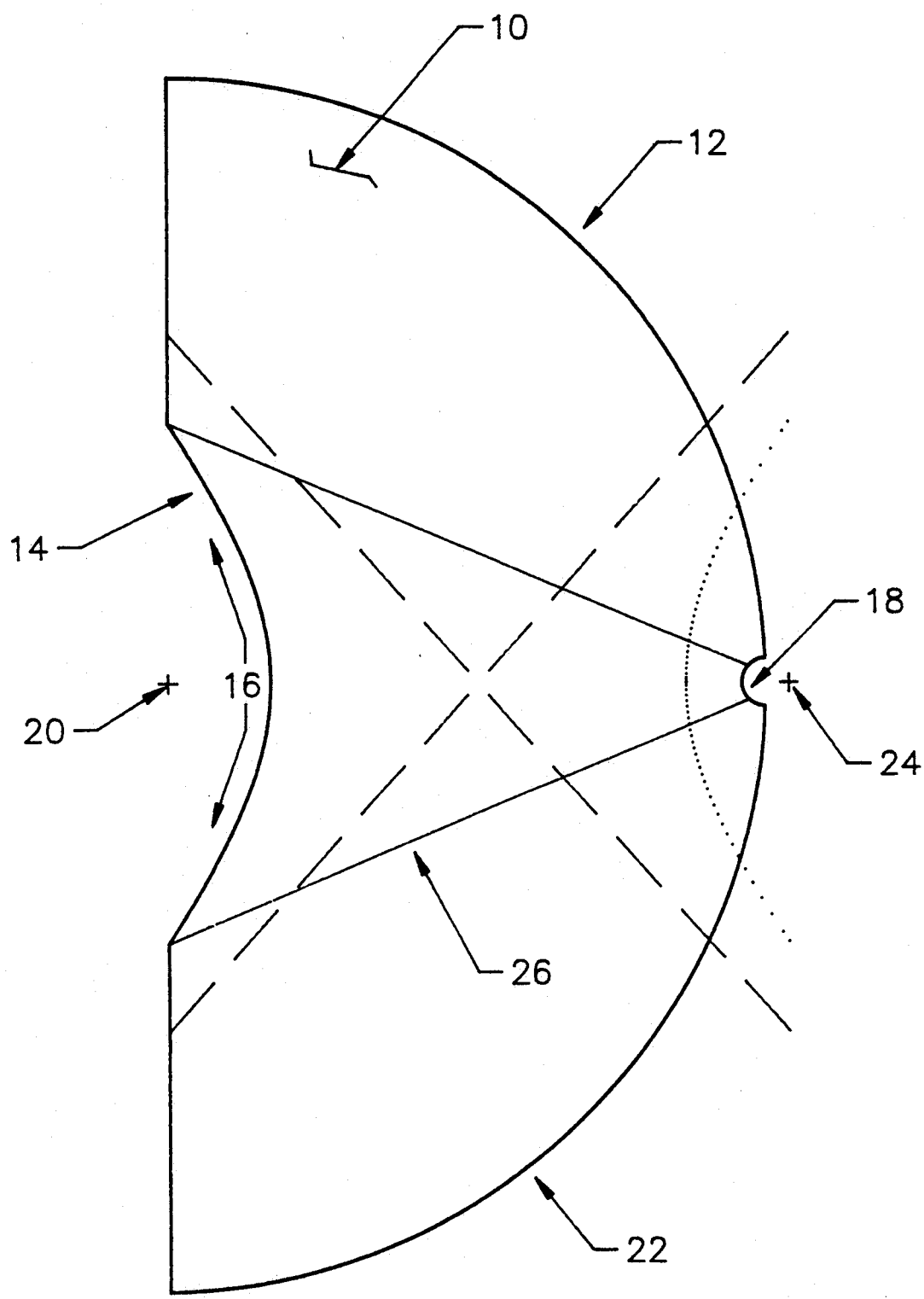
FIG. 1 is a side sectional diagram of a typical lens according to the present invention illustrating the mathematical interrelationships.

Turning first to FIG. 1, there is shown in section, a idealized lens 10 according to the present invention. FIG. 1 shows clearly the interrelation of the various geometric functions which are combined in creating the lens 10.

The lens 10 includes a spherical front surface 12 and a concave rear surface 14 which, in most cases will be hyperbolic. The rear surface 14 has a reflective coating 16 applied which obviates the necessity for "critical angles" to assure reflection of radiation that impinges upon the front surface 12.

A focussing element 18 is placed in the front surface 12. The shape of the focussing element 18, which is, in fact a concavity in the front surface 12, is determined by the nature of the radiation being concentrated and the geometry of the rear surface 14, the intent being to intercept and align the radiation reflected from the rear surface 14 into a narrow, collimated beam which exits the lens 10 in a direction generally opposite that of the incoming radiation.

As can be seen in FIG. 1, the rear surface 14 is a "real" hyperbola with an inner focus 20 that is in the rear plane of the hemisphere 22 that makes up the lens 10. The "imaginary" branch of the hyperbola penetrates the front surface 12 and the outer focus 24 is radially aligned with the inner focus and is displaced outside the lens 10.

The distance between the foci of the hyperbola is equal to or greater than the radius of the hemisphere. The inner focus of the hyperbolic curve ($F_1$) is at the origin of the hemisphere. The outer focus of the hyperbolic curve ($F_2$) is at or outside the surface of the hemisphere, upon the axis of rotation. The radius of the hyperbolic rear surface is equal or less than the radius of the hemisphere so that their intersection lies entirely within the base plane of the hemisphere.

The formulas defining the hyperbola that makes up the rear or reflecting surface 14 are:

$$(y - n)^2/a^2 - x^2/b^2 = 1$$
$$c^2 = (n/2)^2 = a^2 + b^2$$
$$(a^2)^2 + a^2[-2(n/2)^2 - n^2] + (y/2)^4 = 0$$

$$a^2 = \frac{(3n^2/4) \pm \sqrt{(3n^2/4)^2 - 4(y/2)^4}}{2}$$

where semi-axes are a and b, and where c=½ the distance between foci.

The focussing element 18 is at the apex of a cone 26 whose base coincides with the intersection of the hyperbolic rear surface 14 and the base of the hemisphere 22. The cone 26 may be considered the cone of transmission and represents all of the radiation that is collected by the lens and concentrated by the rear reflecting surface and collimated by the focussing element 18. The apex is the outer focus (f²). By choosing the point at which the cone intersects the surface, the width of the beam that is produced is determined.

To determine the origin of the focussing surface, take the point at which the cup intersects the outer edge of the cone and make a line parallel to the axis. This line will be the vector of the emerging frequency to which the focusing cup is "tuned".

After the index of refraction for the lens material is selected for the chosen frequency and the angle of refraction (which is ½ the interior apex angle of the cone) is identified, the angle of incidence can be determined from: IR=sin(Angle of Incidence)/sin(Angle of Refraction). The Angle of Incidence+Angle of Refraction, passing through the same reference point, produces a line which will intersect the axis at the origin of the focusing cup. The spherical indentation, taken from this origin, becomes the focussing surface from which the collimated beam is emitted.

Figure 2:
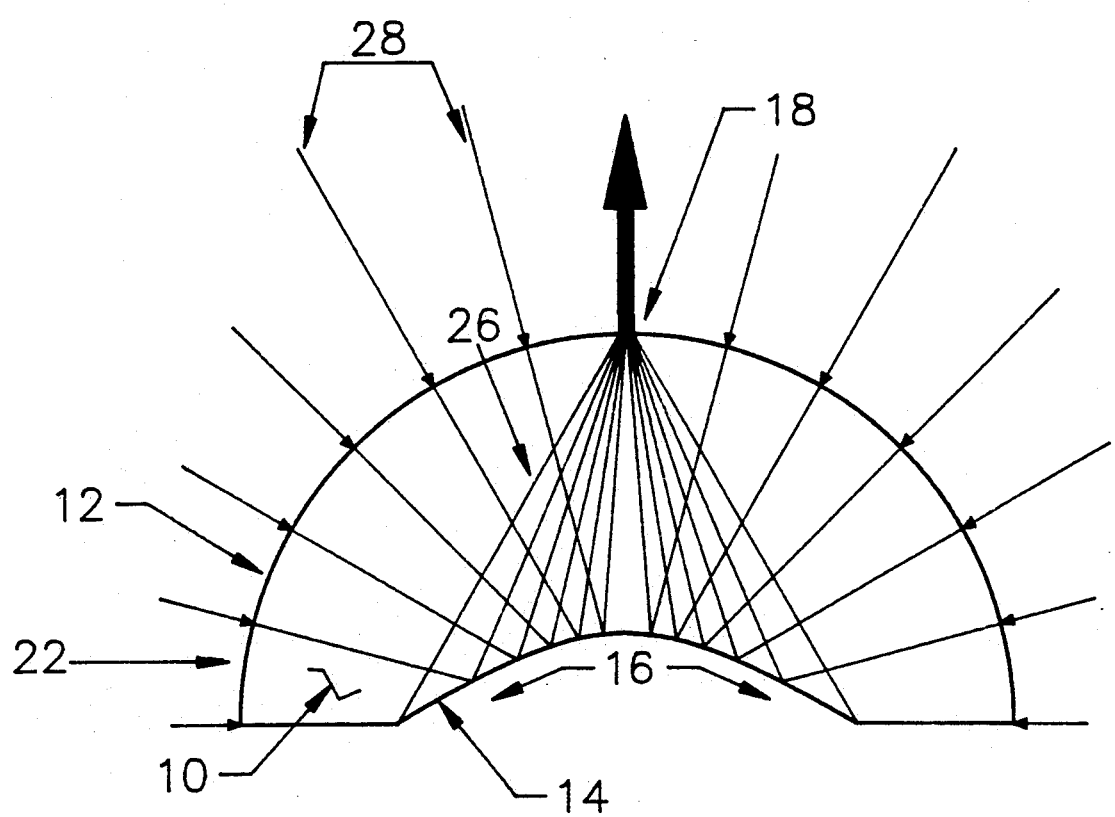
FIG. 2 is a side sectional diagram of a "thick lens" according to the present invention with ray tracings.

Turning next to FIG. 2, the lens of FIG. 1 is shown with ray tracings of impinging radiation. As shown, the rays 28 of radiant energy penetrate the hemisphere 22 from the front surface 12 and are reflected from and focussed by the concave rear surface 14. As seen, the rays fall within the cone 26 and come to a focus at the focussing element 18.

The focussing element 18 collimates the concentrated radiation into a beam 30 that emerges from the lens 10. It is this beam 30, that contains all of the radiant energy that impinges upon the lens 10. If the lens 10 is used in conjunction with a concentrating mirror, then there would have to be an opening in the mirror to permit the beam 30 to reach its intended destination.

A real advantage of the present device is that when used with solar collectors or concentrators, the emerging beam 30 is aimed in the same direction as the source radiation, thereby obviating the need for a device to redirect the beam 30 toward a target device. As a practical matter, the target could be located at the base of the structure that supports the solar collector apparatus.

Figure 3:
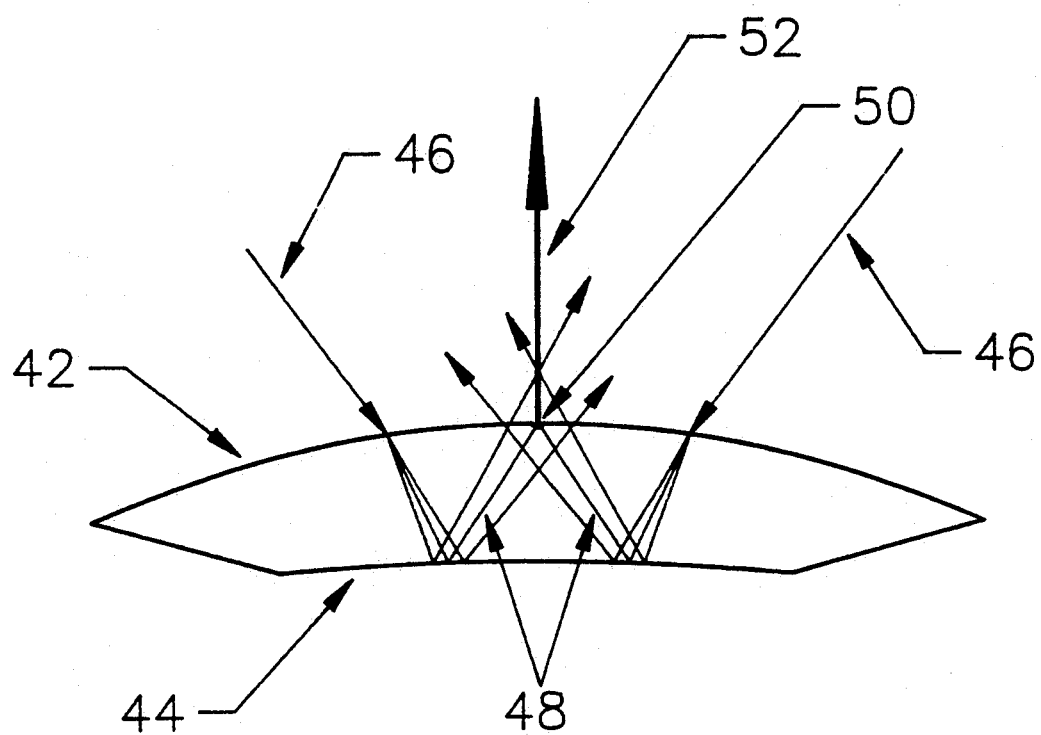
FIG. 3 is a side sectional diagram of a "thin lens" according to the present invention with ray tracings.

An alternative "thin" embodiment is shown in FIG. 3. This embodiment can be utilized when a narrow band of the impinging radiation is desired and can select a predetermined frequency of radiation. A "thin" lens 40 has a shallow, spherical front surface 42 and shallower concave rear surface 44.

The inner focus of the hyperbolic surface is displaced to the "virtual" origin of the circular front surface 42. The equation defining the hyperbola then becomes:

$$r^2 > a^2 + b^2.$$

A correction for the index of refraction i of the lens medium, as well as for the increased angles of incidence.

In this embodiment, the impinging rays 46 separate into the component frequencies and only those rays 48 of the selected frequency focus at the focussing element 50 to produce the emergent, collimated beam 52.

Figure 4:
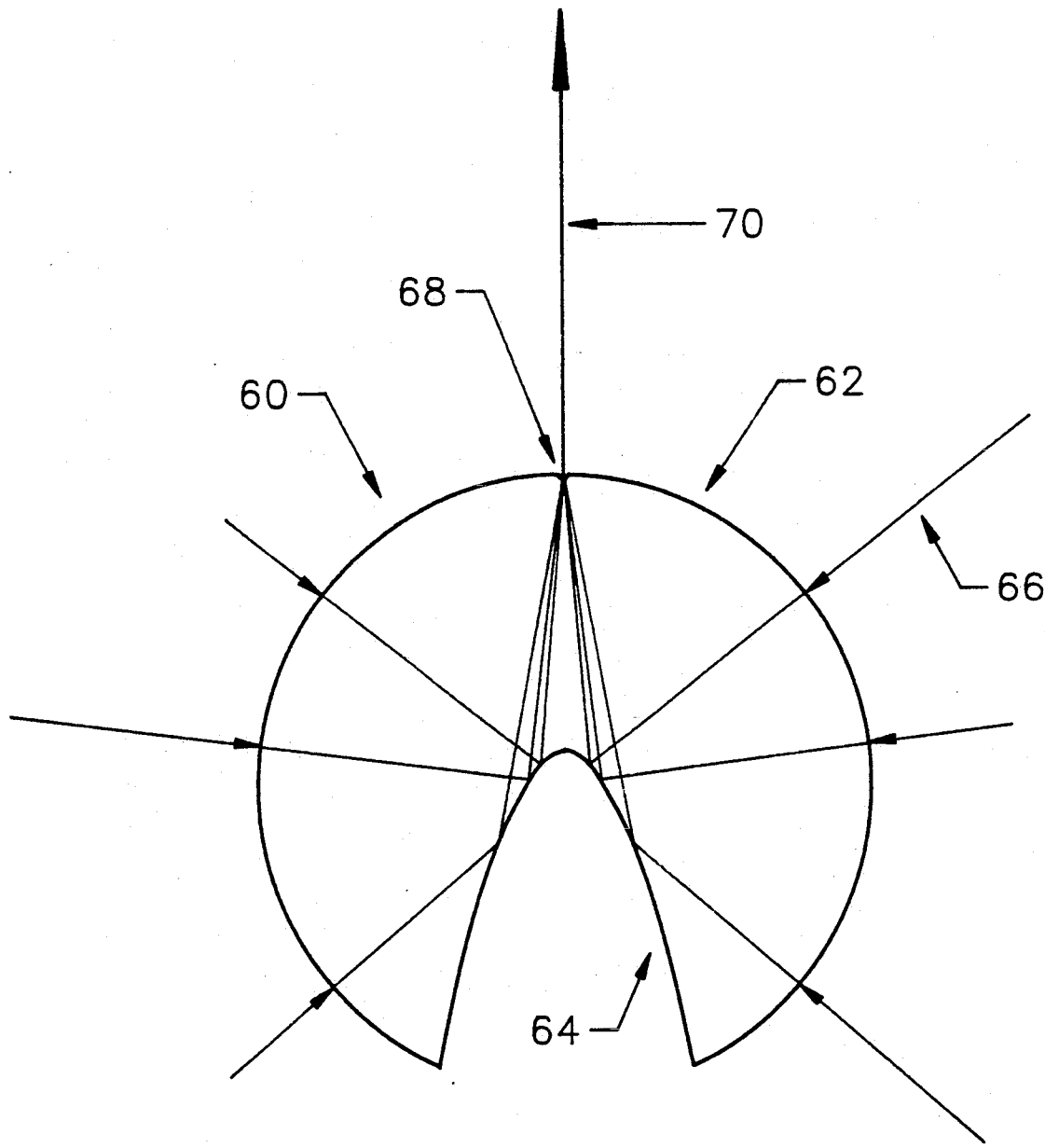
FIG. 4 is a side sectional diagram of a substantially spherical embodiment with ray tracings.

A nearly spherical embodiment is shown in FIG. 4. In this lens 60, a spherical outer surface 62 is combined with a steep and narrow concave inner hyperbolic surface 64, the inner focus of which coincides with the origin of the sphere.

Impinging radiation 66 is reflected off of the hyperbolic surface 64 and is brought to a focus at the focussing element 68 from which the collimated beam 70 emerges.

Figure 5:
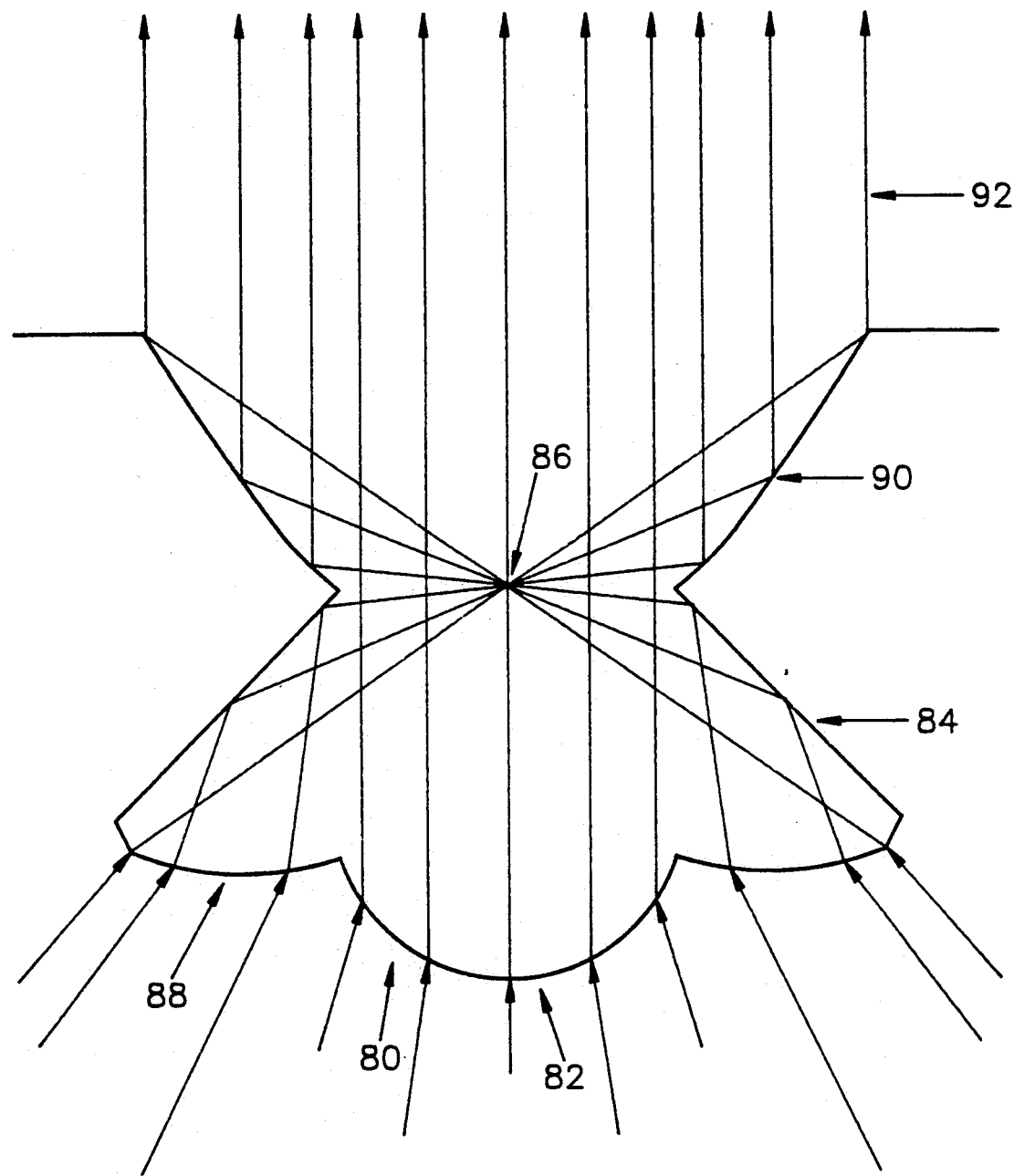
FIG. 5 is a side sectional diagram of a compound focussing aperture with ray tracings.

Turning next to FIG. 5, there is shown a more complex focussing element 80 which may be considered a correcting concavity. This configuration permits a greater angle of acceptance in the region of transmission and spreads the cone of transmission over a greater area of lens surface, without affecting beam width.

The focussing element 80 includes a simple central circular cup or segment 82 which is positioned to receive the central 60° portion of the transmitted beam. A circumferential girdle includes a first, face or conical "ring" band 84 which reflects and re-directs the outer 15° of the cone "upward" to a 2nd focal point 86. The angle of this conical band 84 relative to the optical axis is preferably 45° and almost coincides with the internal cone of transmission.

Immediately adjacent the ring band 84 is a toroidal segment 88 which could be considered a second, peripheral segment which surrounds the cup or central segment. In cross section, the toroidal segment resembles a thin slice of a doughnut with the center of the doughnut coinciding with the central circular cup 82. A second face of the circumferential girdle parabolic cut 90, which is a truncated parabolic reflecting bowl whose focus lies just barely within the remaining base.

To determine the parameters of these elements, a line is first drawn perpendicular to the axis which cuts the front surface of the lens at the desired beam width. The intersection represents the upper edge of the parabolic cut 90. The cone of transmission is projected to intersect and identify the lower (inner) aperture of the parabolic cut 90 at its desired radius. The focus of the parabolic cut 90 can then be chosen. The exact positioning is a design choice but preferably is slightly above the plane of this intersection. Using the above position coordinates, the parabolic section can be defined by the parabola equation:

$$y^2 = 4fx$$

where f is the distance from the focus to the vertex.

At the same point of intersection, project a line parallel to the axis to identify the boundary between the central cup 82 and the toroidal surface 88. The origin of the central cup 82 is determined by the same procedure as in the standard thick lens.

A second line parallel to the axis is drawn at a distance:

$$r_i(\sin^2 90° + \sin^2 45°)$$

where $r_i$ is the inner radius of the parabolic segment. Where the second line intersects the surface of the parabola marks the coordinates of the origin of the circle which forms the curvature of the inner toroidal surface 88. The two circles intersect at a boundary. A cone whose apex coincides with the cone of transmission but whose angle is reduced by the same amount that the focus of the parabola is displaced from the apex becomes the conical surface 84.

The cup 82 and the toroidal surface 88 between the cup 82 and the ring band 84 are transmissive. The inner surface of the first girdle surface or ring band 84 and the second girdle surface or parabolic cut 90 are reflective, thereby redirecting the rays into a collimated emerging beam 92.

Figure 6:
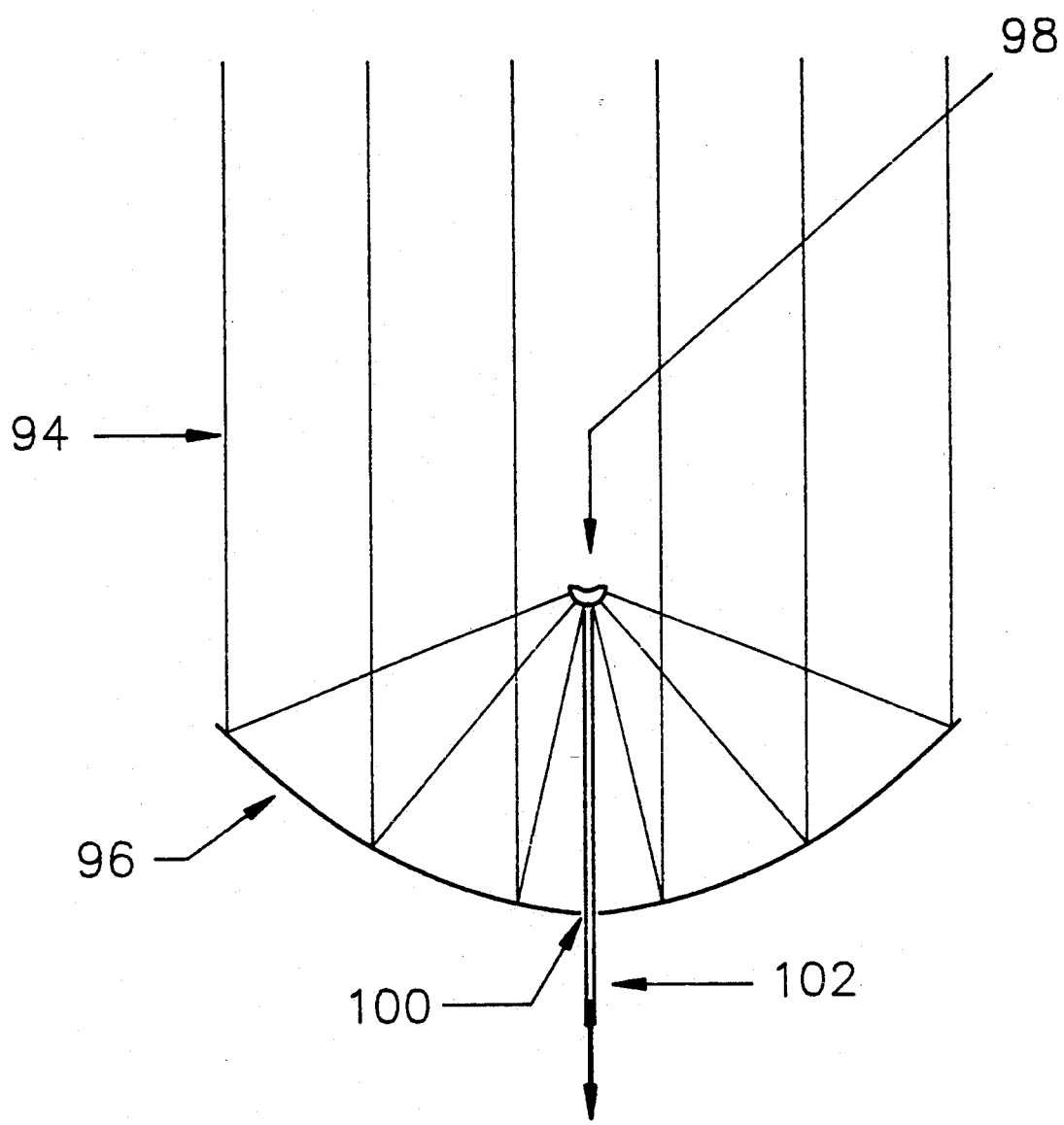
FIG. 6 is a side sectional diagram of a collecting system employing a lens according to the present invention.

Turning finally to FIG. 6, there is shown a typical collecting system employing the lens of the present invention. As seen, incoming radiation 94 is reflected from a reflective collecting dish 96 which redirects the radiation to a collecting and concentrating lens 98 according to the present invention.

Because the lens 98 of the present invention is intended to create a concentrated beam whose direction is opposite to that of the impinging radiation, it is necessary to provide an aperture 100 in the collecting dish 96 through which the emerging, concentrated radiation beam 102 emerges to be employed as a source of radiant energy, either as heat or light.

This heat source can be used in several ways. It can be used in a heat exchanging system to create steam for a turbine driven electrical generator. It could also be used in a desalination application to evaporate salty or brackish water which is subsequently collected. Other uses for such a heat source will occur to those skilled in the art.

Variations on the collecting and concentrating lens of the present invention will also occur to those skilled in the art. Accordingly, the scope of the invention should be limited only by the scope of the claims appended hereto.

What is claimed as new is:

1. A unitary collecting lens assembly having an optical axis comprising in combination:
   a. a first, convex, curved surface of revolution on the obverse face of the lens assembly adapted to receive impinging radiation and to direct the radiation to a reverse face;
   b. a second, concave surface of revolution about the optical axis on the reverse face of the lens assembly;
   c. a reflective coating applied to the reverse face for returning radiation toward a focus at the intersection of the optical axis and the obverse face; and
   d. channelling means in said first surface for redirecting the returning radiation into a narrow, collimated beam that is coaxial with the optical axis; whereby impinging radiation is converted into an intense, concentrated, narrow, collimated beam.

2. The lens assembly of claim 1, above, wherein said first curved surface is hemispherical and is adapted to be placed substantially at the focus of a converging radiation beam.

3. The lens assembly of claim 1, above, wherein said first curved surface is substantially spherical and said second curved surface is hyperbolic.

4. The lens assembly of claim 1, above, wherein said channelling means include a correcting concavity in the obverse face concentric with the optical axis for concentrating radiation reflected from said reflective coating into a collimated parallel beam.

5. The lens assembly of claim 4, above, wherein said concavity is hemispherical.

6. The lens assembly of claim 4, above, wherein said concavity is a parabola of revolution whose axis is coaxial with the optical axis.

7. The lens, assembly of claim 4, above, wherein the base of said correcting concavity includes a central, circular segment having a first radius of curvature and a second, peripheral segment having a second radius of curvature greater than said first radius of curvature.

8. The lens assembly of claim 4, above, wherein said correcting concavity includes a circumferential girdle having a first face proximate the obverse face of the lens assembly and a second face proximate the reverse face of the lens assembly, said second face having a reflective coating for redirecting impinging rays to a focus on the optical axis, and said first face having a reflective coating for directing rays reflected from said second face into a parallel bundle coaxial with the optical axis.

9. The lens assembly of claim 8, above, wherein said first face is a parabola of revolution adapted to redirect impinging rays in a parallel path coaxial with the optical axis.

10. The lens assembly of claim 8, above, wherein said second face is conical for directing impinging radiation to said first face.

11. A collecting lens assembly having an optical axis comprising in combination:
   a. a first, convex, curved surface of revolution on the obverse face of the lens assembly adapted to direct impinging radiation to a reverse face;
   b. a second, concave surface of revolution about the optical axis on the reverse face of the lens assembly; and
   c. a reflective coating applied to the reverse face for returning radiation toward a focus at the intersection of the optical axis and the obverse face; whereby impinging radiation is internally reflected into a narrow, collimated beam that is coaxial with the optical axis.

12. The lens assembly of claim 11, above, wherein said first curved surface is hemispherical and is adapted to be located at the focus of a converging radiation beam reflected from said second surface.

13. The lens assembly of claim 11, above, wherein said first curved surface is adapted to receive parallel radiation.

14. The lens assembly of claim 11, above, wherein said first curved surface is spherical and said second curved surface is hyperbolic.

15. The lens assembly of claim 11, above, further including a correcting concavity in said first surface of the obverse face concentric with the optical axis for redirecting radiation reflected from said reflective coating into a parallel path coaxial with the optical axis.

16. The lens assembly of claim 15, above, wherein said correcting concavity includes a circumferential girdle having a first surface adjacent the obverse face of the lens assembly and a second surface adjacent the reverse face of the lens assembly, said second surface having a reflective coating for redirecting impinging rays to a focus on the optical axis, and said first surface having a reflective coating for directing rays reflected from said second surface into a parallel bundle coaxial with the optical axis.

17. The lens assembly of claim 16, above, wherein said second surface is conical and first surface is parabolic.

18. The lens assembly of claim 16, above, further including a spherical concavity concentric with the optical axis at the base of said correcting concavity.

19. The lens assembly of claim 18, above, further including a toroidal concavity concentric with the optical axis and surrounding said spherical concavity.

* * * * *